(12) United States Patent
Kitamura et al.

(10) Patent No.: US 6,448,619 B1
(45) Date of Patent: Sep. 10, 2002

(54) SEMICONDUCTOR DEVICE

(75) Inventors: Kenji Kitamura; Jun Osanai, both of Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/696,787

(22) Filed: Oct. 26, 2000

(30) Foreign Application Priority Data

Nov. 10, 1999 (JP) .............................................. 11-320158

(51) Int. Cl.$^7$ ................................................ H01L 29/76
(52) U.S. Cl. ........................................ 257/401; 257/360
(58) Field of Search ................................ 257/401, 409, 257/408, 360

(56) References Cited

U.S. PATENT DOCUMENTS 5,276,346 A * 1/1994 Iwai et al. .................. 257/360
5,652,458 A * 7/1997 Ahn ............................ 257/409

\* cited by examiner

*Primary Examiner*—Mark V. Prenty
(74) *Attorney, Agent, or Firm*—Adams & Wilks

(57) ABSTRACT

A semiconductor device has a protection MOS transistor and an operating MOS transistor connected in parallel with the protection MOS transistor. The operating MOS transistor has a gate electrode and a drain region surrounded by the gate electrode.

8 Claims, 7 Drawing Sheets

F I G. 6
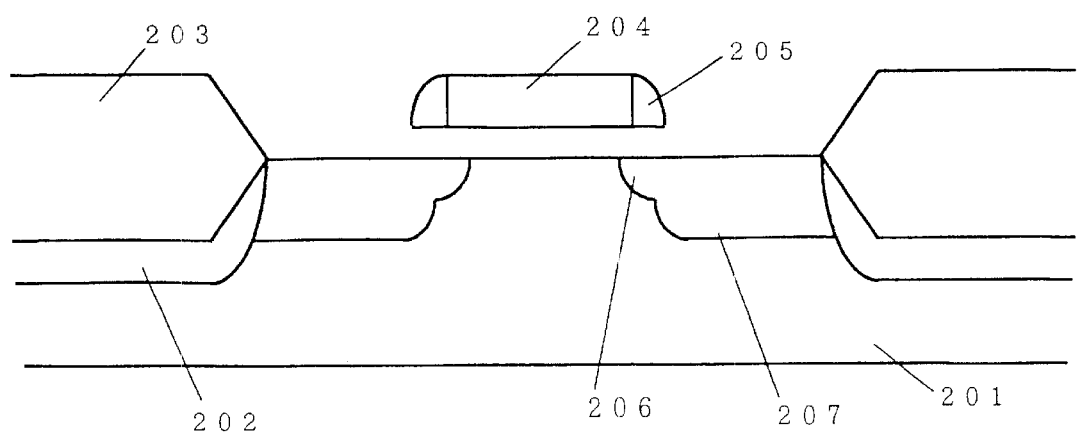

SEMICONDUCTOR DEVICE

BACKGROUND OF THE INVENTION

1. Field of the Invention

The present invention relates to a semiconductor device, and, particularly, to a MOS transistor connected to an external output terminal.

2. Description of the Related Art

It is well known that when an electrified human body or device comes in contact with an IC terminal, the IC breaks down because of ESD (Electro Static Discharge).

As a countermeasure against the ESD, a protection element is normally formed in the inside of the IC. FIG. 3 shows a schematic view showing an output circuit provided with a protection element. In FIG. 3, a transistor 108 operating as an IC function is connected in parallel with a transistor 109 functioning as the protection element. Since a gate electrode 102b is connected to Vss, the protection transistor 109 can not operate. That is, the protection transistor 109 is in a stopped state.

Drains 105a and 105b of the respective transistors are connected to a power source voltage terminal Vdd and an output terminal 107, respectively, and sources 106a and 106b are connected to a Vss terminal (=GND). Normally, with respect to the surface breakdown of the respective transistors, that of the stopped transistor 109 is made lower than that of the operating transistor 108.

When this structure is adopted, even if static electricity enters from the outside, the stopped protection transistor 109 first breaks down to release the electric charge, so that the operating transistor 108 can be protected.

FIG. 2 is a layout view of a conventional semiconductor device. Normally, an operating transistor 108 is provided with two gate electrodes 102a at both sides of a drain 105a. In this case, a junction of the drain 105a and a field doped region (outside of a region 101a) is formed. A field concentration is set so that a parasitic channel is not formed on the surface of a silicon substrate under a field oxide film. The junction withstand voltage of the drain 105a and the field is changed by each concentration, and as the concentration becomes high, the withstand voltage becomes low.

Normally, the concentration is set so that the junction withstand voltage becomes higher than the surface breakdown of the transistor 108. However, according to a process, there is a case where the field concentration becomes high, so that the junction withstand voltage becomes lower than the surf ace breakdown. When the junction withstand voltage becomes lower than the surface breakdown of a transistor 109 connected in parallel, or the junction withstand voltage of a drain 105b of the transistor 109 and a field doped region (outside of a region 101b), the ESD comes to be applied to the transistor 108 and breaks down the transistor 108.

Like this, in the case where the junction withstand voltage of the drain of the operating transistor and the field doped region is lower than the surface breakdown of the operating transistor, and the junction withstand voltage becomes lower than the surface breakdown of the stopped transistor, there has been a possibility that the ESD is applied to the operating transistor and the element breaks down.

SUMMARY OF THE INVENTION

The present invention has been made in view of the above drawbacks in the conventional art and has an object to provide a semiconductor device which can solve the above problem.

If the withstand voltage of the transistor 108 is higher than the withstand voltage of the transistor 109, the ESD is applied to the transistor 109 as a protection element, and the transistor 108 can be protected.

Accordingly, the present invention adopts the following means.

(1) In a circuit in which an operating MOS transistor and a stopped state MOS transistor are connected in parallel with each other, a drain of the operating MOS transistor is surrounded by a gate electrode.

(2) The operating MOS transistor is connected to an external output terminal.

(3) A gate electrode of the stopped state MOS transistor is connected to GND.

(4) The circuit in which the operating MOS transistor and the stopped state MOS transistor are connected in parallel with each other is made a part of an output circuit of a voltage detection IC.

(5) The circuit in which the operating MOS transistor and the stopped state MOS transistor are connected in parallel with each other is made a part of an output circuit of a battery protection IC.

(6) A source/drain of the operating MOS transistor is made a concentration region of more than or equal to two kinds of low concentration and high concentration.

(7) A source/drain of the stopped state MOS transistor is made a concentration region of one kind of high concentration.

(8) The source/drain of the stopped state MOS transistor is made of phosphorus.

(9) The operating MOS transistor is made such a transistor whose a junction withstand voltage is higher than a surface breakdown.

(10) The surface breakdown of the stopped state MOS transistor is made lower than the surface breakdown of the operating MOS transistor.

(11) The maximum operating voltage of the voltage detection IC is made 7 V to 12 V.

(12) The maximum operating voltage of the battery protection IC is made 7 V to 12 V.

BRIEF DESCRIPTION OF THE DRAWINGS

FIG. 6 is a sectional view of a first example of an operating transistor of a semiconductor device of the present invention.

DETAILED DESCRIPTION OF THE PREFERRED EMBODIMENT

An embodiment of the present invention will be described below with reference to the drawings.

Figure 1:
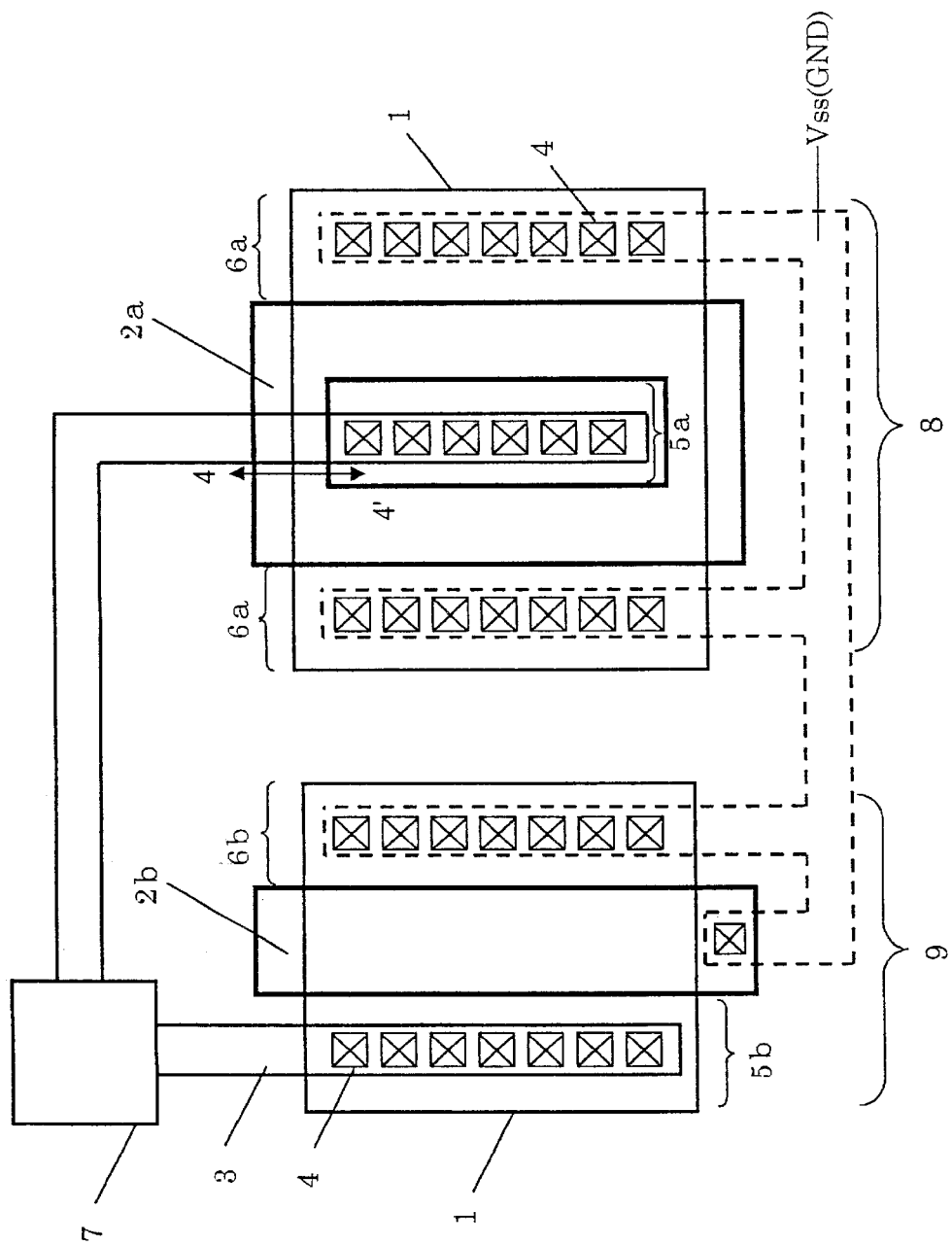
FIG. 1 is a layout view of a semiconductor device of the present invention.

FIG. 1 is a layout view of a semiconductor device of the present invention. A transistor 8 operating as an IC function and a stopped state transistor 9 functioning as a protection element are connected to an output terminal 7 in parallel with each other. The respective transistors are constructed by providing gate electrodes 2a and 2b, drains 5a and 5b, and sources 6a and 6b in regions 1. The respective electrodes are through contacts 4, and the drains 5a and 5b are connected to the output terminal 7, and the sources 6a and 6b and the gate electrode 2b of the transistor 9 are connected to Vss (=GND), through wiring lines 3, respectively.

In the present invention, since the drain 5a of the transistor 8 is surrounded by the gate electrode 2a, a junction of the drain 5a and a field doped region (outside of the region 1) is not formed. By this, even if a field concentration becomes high, the junction withstand voltage does not become low.

Conventionally, the junction withstand voltage is 14.5 V. On the other hand, in the present invention, the drain is surrounded by the gate electrode, so that the junction withstand voltage becomes 18.1 V, and becomes higher than a surface breakdown of 15.8 V.

Figure 2:
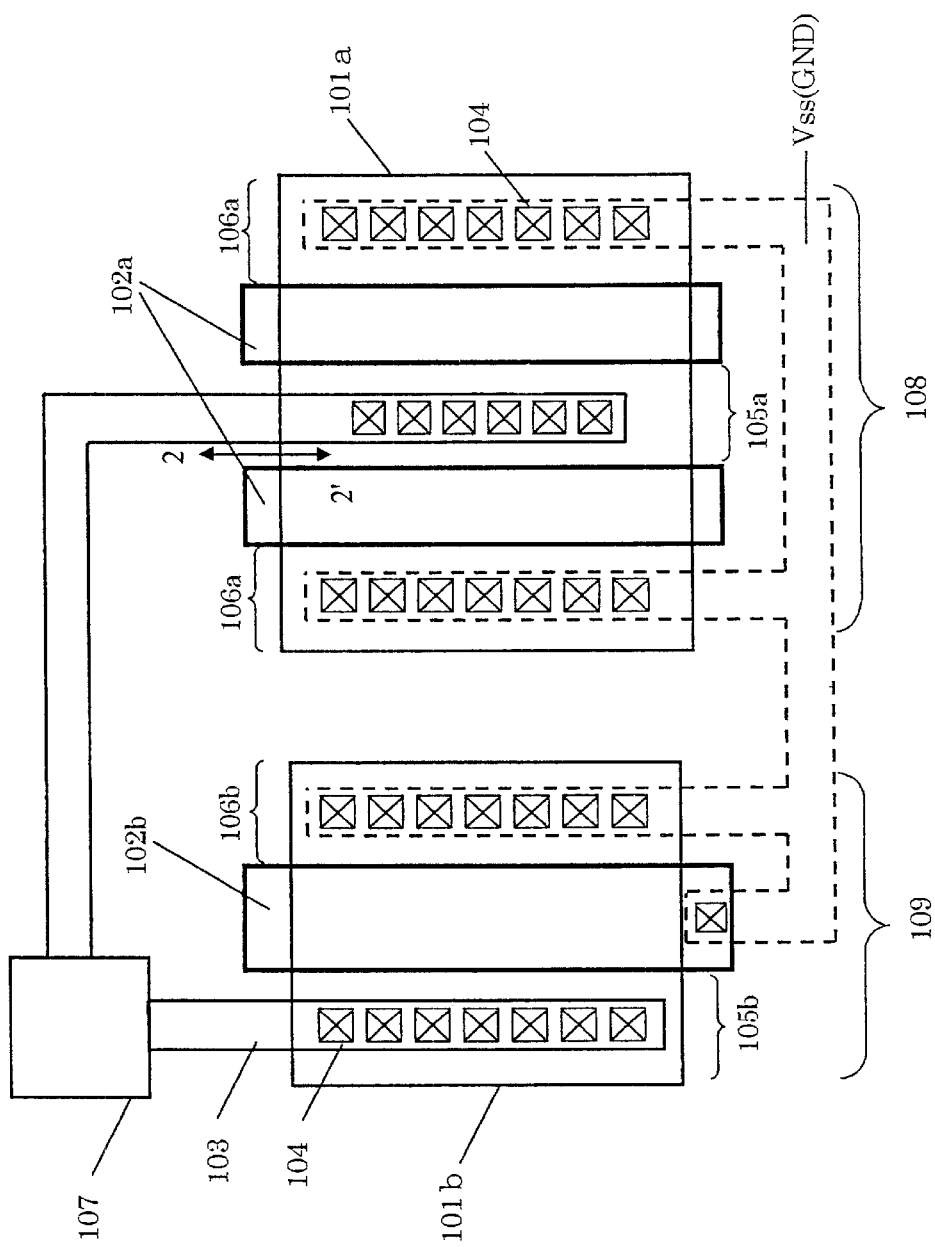
FIG. 2 is a layout view of a conventional semiconductor device.
Figure 3:
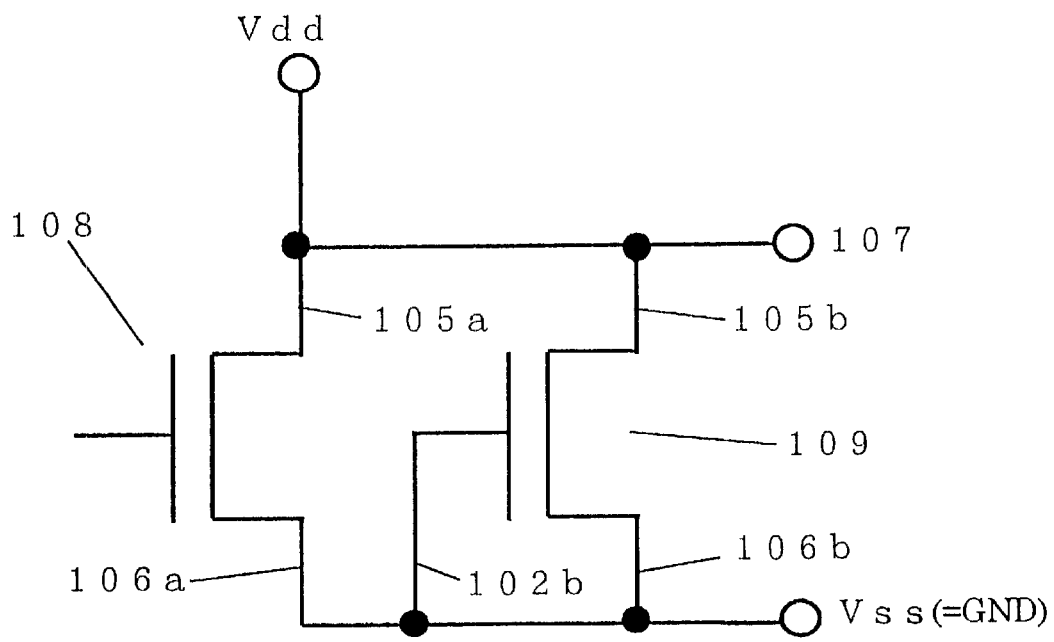
FIG. 3 is a schematic view of an output circuit.
Figure 4:
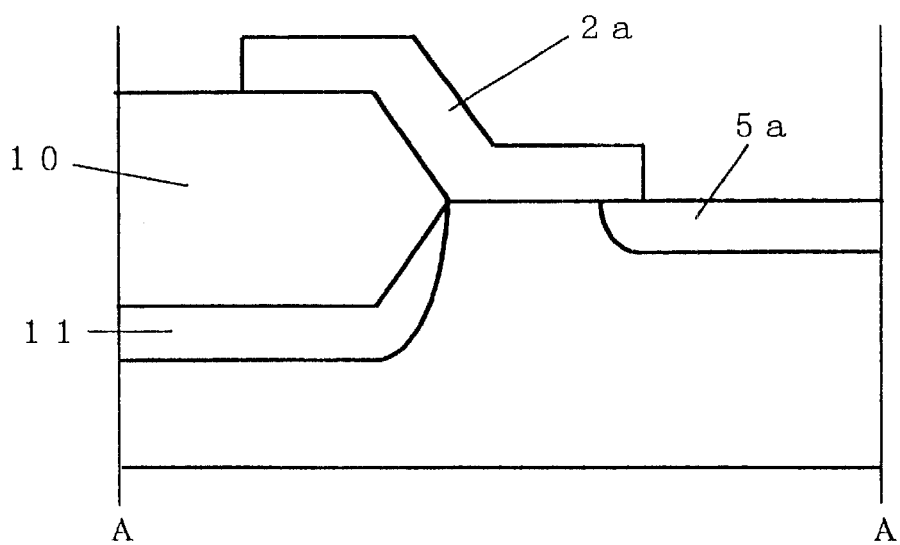
FIG. 4 is a sectional view of a semiconductor device of the present invention taken along line 4–4' in Fig. 1.
Figure 5:
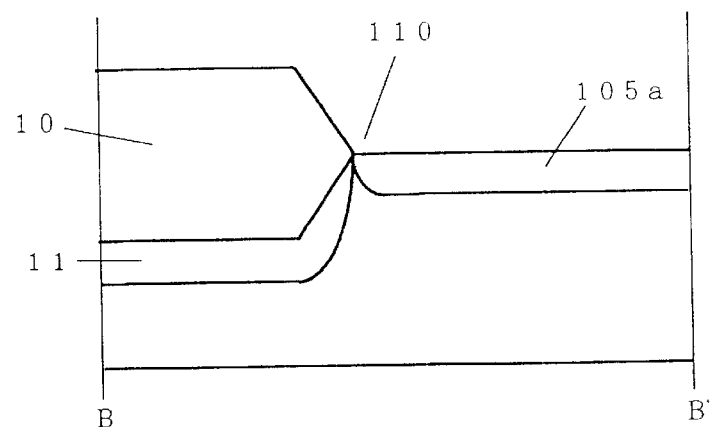
FIG. 5 is a sectional view of a conventional semiconductor device taken along line 5–5' in FIG. 2.

FIG. 4 is a sectional view of a portion taken along line 4–4' of FIG. 1. Since the drain 5a is formed after the formation of the gate electrode 2a, a junction to a field doped region 11 is not formed. By this, even if the field concentration becomes high, the junction withstand voltage does not become low. On the other hand, as a conventional example, FIG. 5 is a sectional view of a portion taken along line 5–5' of FIG. 2. In FIG. 5, since there is not gate electrode, a junction 110 of the drain 105a and the field doped region 11 is formed.

FIG. 6 is a view showing an example of a sectional structure of an operating transistor of the present invention. The transistor includes, on a substrate 201, a gate electrode 204, a side spacer 205, a source/drain 207, and an LDD (Light Doped Drain) 206, and is separated from other elements by a field oxide film 203. A field doped region 202 for preventing a parasitic channel is formed under the field oxide film. In the present invention, a P-type silicon substrate was used as the substrate 201. A P well may be formed in the substrate.

Arsenic of an N-type impurity was used for the source/drain 207, phosphorus was used for the LDD 206, and P-type boron was used for the field doped region 202. Arsenic was made 4 to 7 E15/cm$^2$. The lower limit concentration is determined by a contact resistance to a wiring line. Phosphorus was made 5 E12/cm$^2$ to 8 E13/cm$^2$. A field dope concentration was made 5 E13/cm$^2$ to 2 E14/cm$^2$. The field dope concentration is determined under such a condition that even if a wiring line to which a voltage of 8 to 15 V is applied is provided on the field oxide film, an inversion layer is not formed on the surface of the substrate (field doped region 202). This inversion layer is called a parasitic channel, and causes an erroneous operation of an IC. Since the source/drain 207 is in contact with the field doped region 202 at these concentrations, the junction withstand voltage becomes lower than the surface breakdown.

Figure 7:
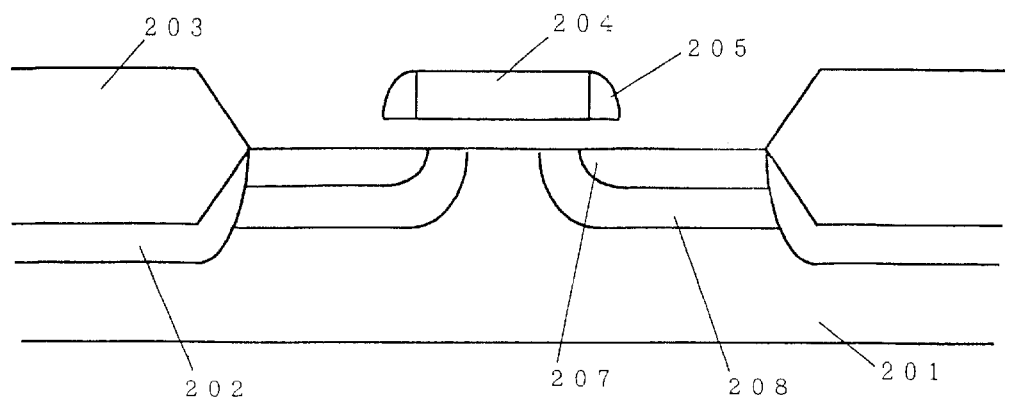
FIG. 7 is a sectional view of a second example of an operating transistor of a semiconductor device of the present invention.

FIG. 7 is a view showing another example of a sectional structure of an operating transistor of the present invention. The transistor includes, on a substrate 201, a gate electrode 204, a side spacer 205, a source/drain 207, and a DDD 208, and is separated from other elements by a field oxide film 203. Phosphorus of the DDD 208 is made 1 to 2 E14/cm$^2$. Conditions other than this are the same as those of the transistor of FIG. 4.

Figure 8:
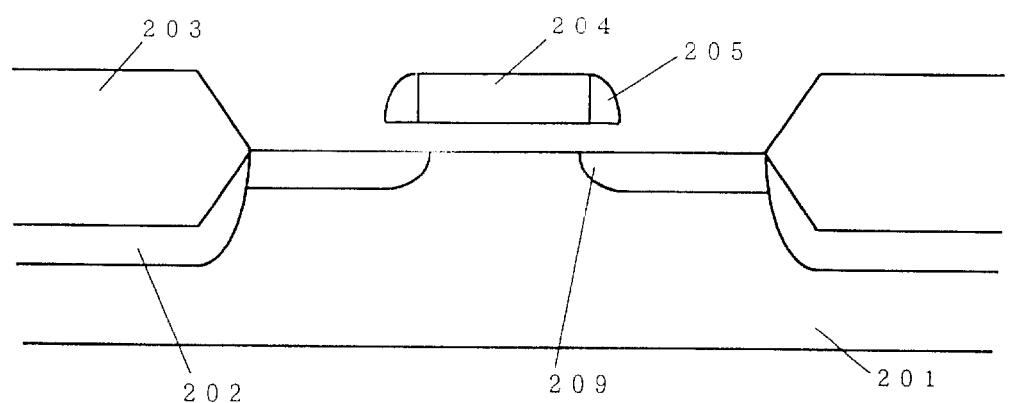
FIG. 8 is a sectional view of a first example of a stopped state transistor of a semiconductor device of the present invention.

FIG. 8 is a view of an example of a sectional structure of a stopped state transistor of the present invention. The transistor includes, on a substrate 201, a gate electrode 204, a side spacer 205, and a source/drain 209, and is separated from other elements by a field oxide film 203. A field doped region 202 for preventing a parasitic channel is formed under the field oxide film. In the present invention, a P-type silicon substrate was used as the substrate 201. A P well may be formed in the substrate. Phosphorus of an N-type impurity was used for the source/drain 207, and P-type boron was used for the field doped region 202. Phosphorus was made 4 to 7 E15/cm$^2$, and a field dope concentration was made 5 E13/cm$^2$ to 2 E14/cm$^2$.

Since the concentration is set so that the surface breakdown of the transistor shown in FIG. 6 or FIG. 7 becomes higher than the surface breakdown of the transistor of FIG. 8, the element does not break down because of the ESD.

Figure 9:
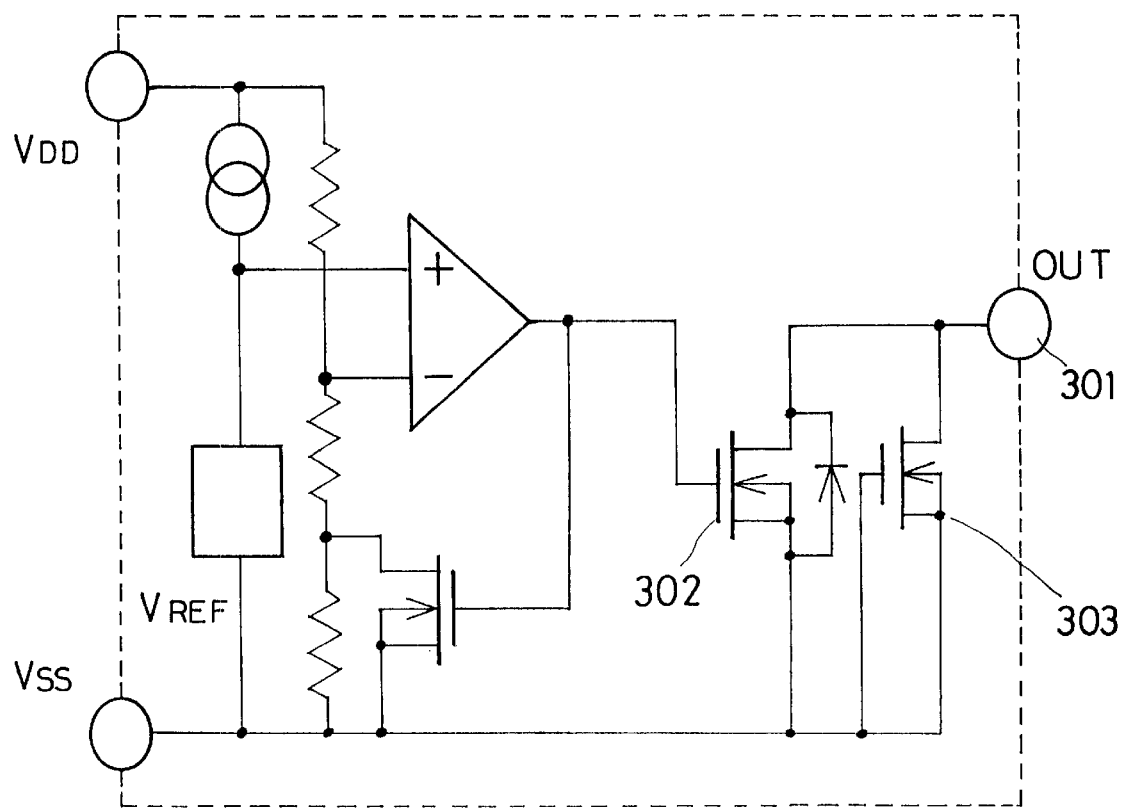
FIG. 9 is a circuit diagram of a voltage detection IC.

FIG. 9 is a circuit diagram of an example of a voltage detection IC using the present invention. An Nch-MOS transistor 302 performing the operation of the present invention is connected to an output terminal OUT 301, and although not shown in the circuit diagram, a stopped state MOS transistor in parallel with this transistor 302 is connected. The maximum operation voltage of this IC is at the range of 7 V to 12 V.

Figure 10:
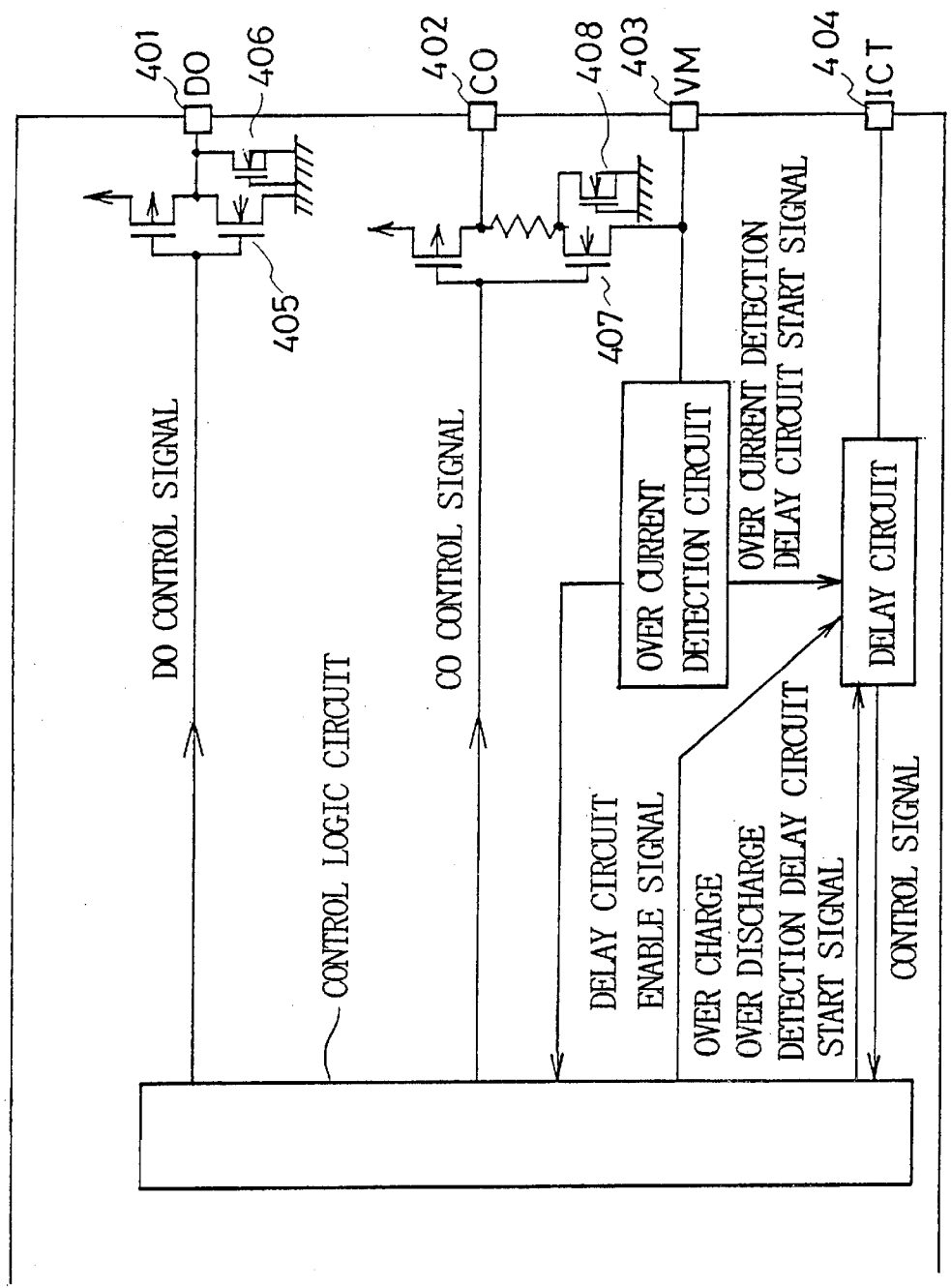
FIG. 10 is a circuit diagram of a battery protection IC.

FIG. 10 is a circuit diagram of an example of a battery protection IC using the present invention. Nch-MOS transistors performing the operation of the present invention are connected to output terminals D0401, C0402, VM403, and ICT404, and although not shown in the circuit diagram, stopped state MOS transistors in parallel with the transistors are connected. The maximum operation voltage of this IC is at the range of 7 V to 12 V.

As described above, according to the present invention, since a drain of an operating transistor connected to an output terminal is surrounded by a gate electrode, the junction withstand voltage is higher than the surface breakdown, and the surface-breakdown of the operating transistor is higher than the surface breakdown of a stopped state transistor connected in parallel, so that the operating transistor can be protected against the ESD.

What is claimed is:

1. A semiconductor device comprising: a voltage detection integrated circuit having an output circuit comprised of a protection MOS transistor and an operating MOS transistor connected in parallel with the protection MOS transistor, the operating MQS transistor having a gate electrode and a drain region surrounded by the gate electrode.

2. A semiconductor device according to claim 1; wherein the maximum operating voltage of the voltage detection integrated circuit is within a range of 7 V to 12 V.

3. A semiconductor device comprising: a battery protection integrated circuit having an output circuit comprised of a protection MOS transistor and an operating MOS transistor connected in parallel with the protection MOS transistor, the operating MOS transistor having a gate electrode and a drain region surrounded by the gate electrode.

4. A semiconductor device according to claim 3; wherein the maximum operating voltage of the battery protection integrated circuit is within a range of 7 V to 12 V.

5. A semiconductor device comprising: an output circuit having a protection MOS transistor; an operating MOS transistor connected in parallel with the protection MOS transistor, the operating MOS transistor having a gate electrode, a drain region surrounded by the gate electrode, and a surface breakdown voltage higher than that of the protection MOS transistor; and a voltage detection integrated circuit having the output circuit.

6. A semiconductor device according to claim 3; wherein the maximum operating voltage of the voltage detection integrated circuit is within a range of 7 V to 12 V.

7. A semiconductor device according to claim 5; further comprising a battery protection integrated circuit having the output circuit.

8. A semiconductor device according to claim 7; wherein the maximum operating voltage of the battery protection integrated circuit is within a range of 7 V to 12 V.

* * * * *